United States Patent [19]

Johnson

[11] Patent Number: 4,680,220
[45] Date of Patent: Jul. 14, 1987

[54] DIELECTRIC MATERIALS

[75] Inventor: Daniel D. Johnson, Yorklyn, Del.

[73] Assignee: W. L. Gore & Associates, Inc., Newark, Del.

[21] Appl. No.: 705,538

[22] Filed: Feb. 26, 1985

[51] Int. Cl.⁴ .............................................. B32B 5/16
[52] U.S. Cl. ................................ 428/241; 174/209; 428/240; 428/242; 428/244; 428/246; 428/260; 428/251; 428/280; 428/281; 428/282; 428/283; 428/284; 428/285; 428/413; 428/418; 428/421; 428/422; 428/457; 428/473.5; 428/901
[58] Field of Search ............... 428/280, 281, 282, 283, 428/240, 241, 242, 244, 246, 260, 325, 901, 421, 422, 457, 413, 418, 284, 285, 473.5, 251; 174/209

[56] References Cited

U.S. PATENT DOCUMENTS 4,241,132 12/1980 Pratt et al. ..................... 428/285

Primary Examiner—James J. Bell
Attorney, Agent, or Firm—Mortenson & Uebler

[57] ABSTRACT

Dielectric materials having low dielectric constant are provided, the materials comprising fabrics impregnated with thermosetting resins, at least a portion of the fibers in the fabrics being fluorocarbon fibers. Also provided is a method of manufacture of these dielectric materials. The dielectric materials are useful in the fabrication of multilayer printed circuit boards.

35 Claims, 10 Drawing Figures

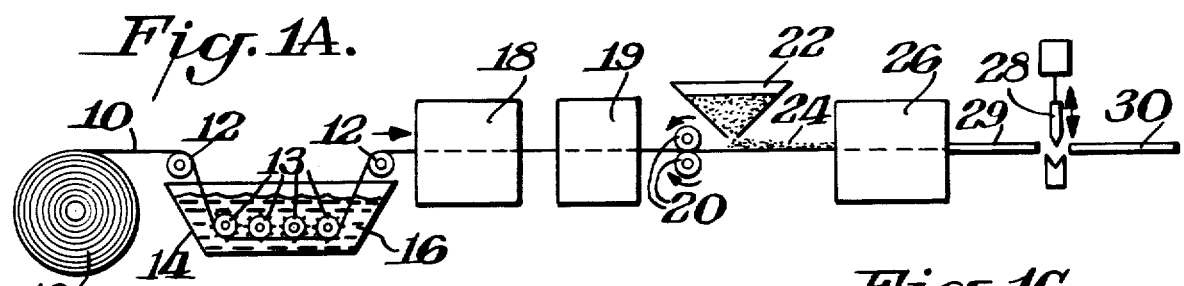
Fig. 1A.
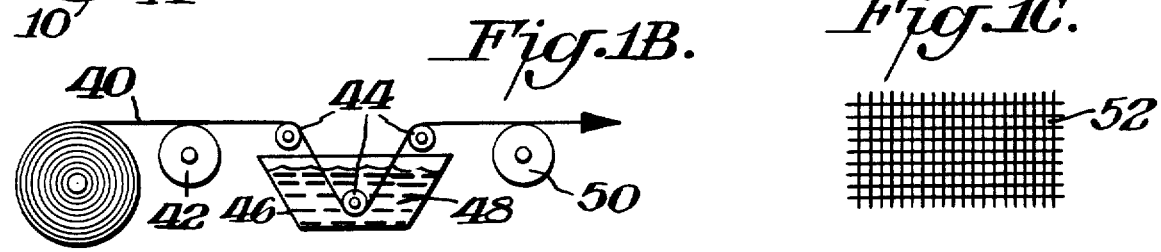
Fig. 1B.
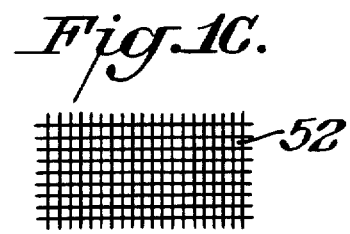
Fig. 1C.
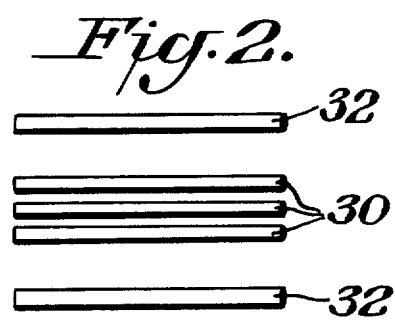
Fig. 2.
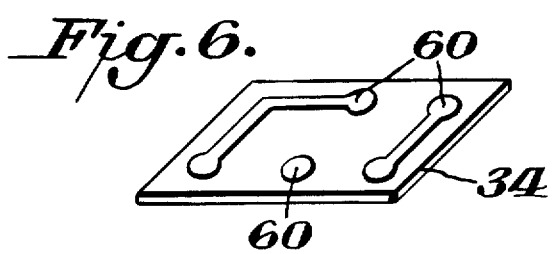
Fig. 6.
Fig. 3. heat, pressure
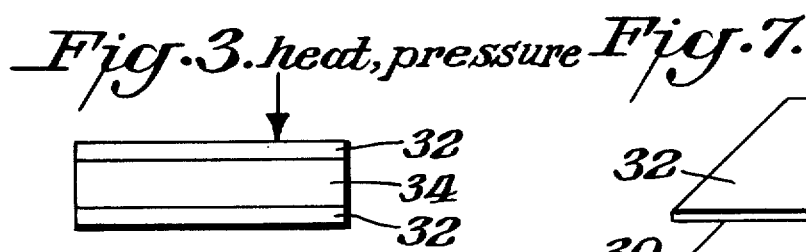
Fig. 7.
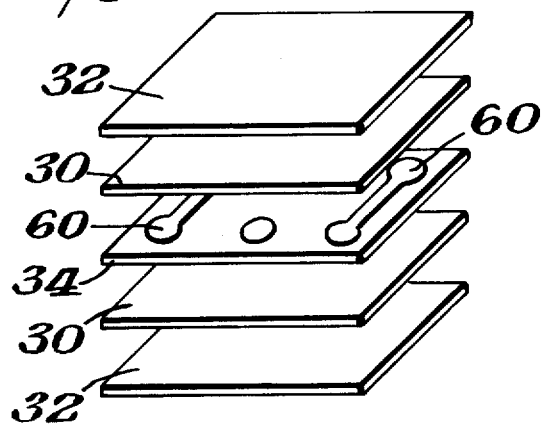
Fig. 4.
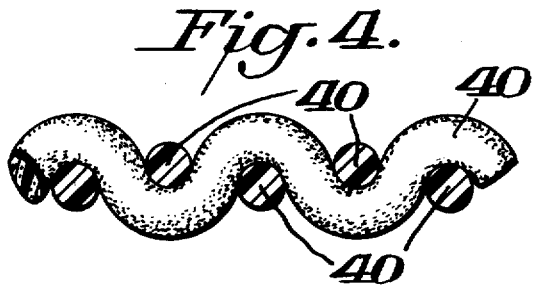
Fig. 5.
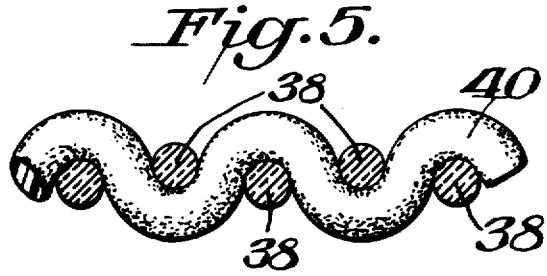
Fig. 8.
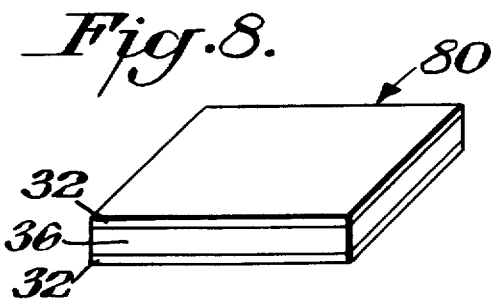

DIELECTRIC MATERIALS

BACKGROUND OF THE INVENTION

The present invention is related to low dielectric constant dielectric materials suitable for use, without limitation, in multilayer printed circuit boards.

The principal conventional dielectric material in present use for printed circuit boards is a laminated composite comprised of fiberglass fabric impregnated with a thermosetting epoxy resin, referred to by the National Electronic Manufacturers Association (NEMA) classification as FR-4. FR-4 is produced by impregnating fiberglass fabric with a liquid, thermosetting epoxy resin. The resin in the impregnated fabric is partially cured with heat to form a dry, flexible sheet in which the resin is in an intermediate cure-state, termed "B"-stage or "pre-preg" sheet. One or more sheets of pre-preg are then stacked together to a desired thickness and laminated together by further curing under heat and pressure to form a laminated composite in which the resin is in a fully-cured state, termed the "C"-stage state.

During the lamination process, the B-stage epoxy resin of the pre-preg sheet is converted to fully-cured C-stage resin. Normally, the sheets of pre-preg are bonded to one or two sheets of copper foil during the lamination process so that the laminated composite consists of dielectric material clad on one or both sides with copper foil. This composite material is referred to as the FR-4 copper clad laminate and is fabricated into single and double sided printed circuit boards.

Where very high circuit densities are requires, printed circuit boards with more than two layers of circuitry have been developed, called multilayer printed circuit boards. Thin dielectric FR-4 copper clad laminate is fabricated into single or double sided circuit patterns called innerlayers. One or more of these innerlayers are interleaved with one or more sheets of B-stage pre-preg and laminated together under heat and pressure to form a homogeneous, void free multilayer structure. The lamination process converts the B-stage epoxy resin of the pre-preg into C-stage resin, bonding the innerlayers together and providing insulation between the circuit layers. The multilayered structure is further processed into a multilayer printed circuit board.

The thermosetting resin is essential to the fabrication of multilayer printed circuit boards in which the resin is uniform throughout. The B-stage resin in the pre-preg is converted to a fully-cured C-stage state without melting or materially altering the C-stage dielectric material in the innerlayers. Because the intermediately cured pre-preg is essentially the same composition as the C-stage resin in the innerlayers, the multilayer composite is dimensionally stable and easily processed.

There is a need in the electronics industry for dielectric materials having lower dielectric constants than that of convention materials because signal speeds and operating frequencies of electronic systems have increased dramatically. Lower dielectric constant dielectric materials both decrease capacitive coupling and increase the speed of the electronic signal so that electronic systems can process data at greater speeds.

FR-4 laminate has a relatively high dielectric constant, approximately 5.0 at 1 megahertz. This is a result of the high dielectric constant contribution of the fiberglass, 6.II, averaged with the lower dielectric constant of the epoxy resin, 3.4. To achieve a lower dielectric constant dielectric material, the electronics industry has turned to laminated composites comprised of fiberglass fabric impregnated with fluorocarbon resins. These laminated composites have a dielectric constant of approximately 2.5 at 1 megahertz. However, fluorocarbons are not thermosetting resins and are extremely difficult to fabricate into multilayer printed circuit boards. At temperatures at which the fluorocarbon pre-preg sheets will bond the package together, the innerlayers can melt or lose their dimensional stability. If FR-4 pre-pregs are used to bond the fluorocarbon innerlayers together, the resulting multilayer composite is nonhomogeneous and the dielectric constant is raised as a result of the higher dielectric constant of the pre-preg.

Other specialty dielectric materials have been developed which utilize fibers other than fiberglass in combination with thermosetting resins. Laminated composites of polyaramide fibers and epoxy resins have a dieletric constant of 3.8, which is considerably higher than the fluorocarbon composites. Quartz fibers have been used in composites, but quartz fibers have nearly the same dielectric constant as polyaramide fibers.

SUMMARY OF THE INVENTION

A dielectric material is provided comprising a fabric having fibers and interstices between the fibers, in which at least a portion of the fibers in the fabric are fluorocarbon fibers, the fabric being impregnated within the interstices between the fibers with a thermosetting resin cured to at least the semi-cured, B-stage state, the dieletric constant of this dielectric material being less than 3.5, preferably less than 3.0. The thermosetting resin may be cured to the fully-cured, C-stage state and the dielectric material may have electrically conductive foil bonded to at least one surface thereof.

Also provided is a laminated composite structure comprising one or more sheets of this dielectric material in which the thermosetting resin is cured to the fully-cured, C-stage state, and one or more sheets of the dielectric material in which the thermosetting resin is cured to the semi-cured, B-stage state, oriented such that, wherever a layer of material in the C-stage state contacts another layer, the other layer is of material in the B-stage state.

In a laminated composite structure comprising one or more sheets of this dielectric material in which the thermosetting resin is cured to the fully-cured, C-stage state, and having an electrically conductive foil bonded to at least one side of at least one of the sheets, and one or more sheets of the dielectric material in which the thermosetting resin is cured to the semi-cured, B-stage state, the layers are oriented such that, wherever a layer of material in the C-stage state, and wherever an electrically conductive foil contacts another layer, the other layer is of material in the B-stage state.

In use for electrical applications, the thermosetting resin in the dielectric material is cured to the fully-cured, C-stage state, throughout the laminated composite. The composite structure may have at least one additional layer of a material other than the dielectric material of this invention. This additional layer may be a layer of epoxy/fiberglass, fluorocarbon/fiberglass, polyimide/fiberglass, epoxy/polyaramide fiber, epoxy/quartz fiber and polyimide/quartz fiber composites. The thermosetting resin may be an epoxy, polyimide, polyamide, polyester, phenolic or an acrylic thermosetting resin. It is preferably an epoxy resin. All fibers in the fabric can be fluorocarbon fibers or combinations of fluorocarbon fibers with fiberglass fibers, polyaramide fibers, or quartz fibers. The fabric may be a woven fabric or a non-woven felt or mat. The fluorocarbon fibers are PTFE fibers which may be drawn, nonporous, sintered PTFE fibers or expanded, porous PTFE fibers. The fluorocarbon fibers may contain a filler which can be a dielectric insulator material such as ceramic Wc or glass, or it may be electrically conductive such as electrically conductive or semi-conductive metals, metal oxides or carbon. The dielectric material is useful in a printed circuit laminated composite, as a dielectric insulator for submicrowave or microwave signals. It may be used in a microwave printed circuit board and in a microwave radome.

Also provided is a process for making the dielectric material comprising: (a) treating fluorocarbon fibers to render them wettable by an uncured thermosetting resin, the fibers being held under longitudinal tensin during such treatment, thereby preventing longitudinal shrinkage of the fiber during treatment, (b) weaving the fabric containing at least a portion of the treated fluorocarbon fibers, (c) impregnating the fabric with an uncured thermosetting resin, and (d) heating and drying the resin-impregnated-fabric to cure the resin to at least the semi-cured, B-stage state. Alternatively, the process for making the dielectric material may comprise the steps of: (a) treating a fabric containing at least a portion of fluorocarbon fibers to render the fluorocarbon fibers wettable by an uncured thermosetting resin, the fabric being restrained from shrinkage during such treatment or, alternatively, the fabric being allowed to shrink during treatment and stretched to nearly its original dimensions after treatment, (b) impregnating the fabric with an uncured thermosetting resin, and (c) heating and drying the resin-impregnated-fabric to cure the resin to at least the semi-cured, B-stage state. The process may include the step of calendering the fabric to reduce its thickness. The treatment to make the fluorocarbon fibers wettable includes applying an alkali naphthanate solution to the fluorocarbon fibers or fabric. The process may include napping the fluorocarbon fibers to improve wettability and adhesion between fibers and resin. The fibers or fabric can be bleached subsequent to the treatment to make them wettable, in order to lighten the color of the fibers.

BRIEF DESCRIPTION OF THE DRAWINGS

FIG. 1A is a schematic conceptual view of a process for making the dielectric material of this invention.

FIG. 1B is a schematic diagram of a process for treating a fluorocarbon fiber which can be woven into a fabric, shown in FIG. 1C, and which can be processed in a similar manner as in FIG. 1 to make the dielectric material of this invention.

FIG. 2 shows a stack of pre-preg sheets of this invention having sheets of metal foil above and below the pre-preg sheets.

FIG. 3 shows the result of applying heat and pressure to the sheets of FIG. 2, to produce a composite having fully-cured, C-stage resin and the copper foil bonded thereto on both top and bottom.

FIG. 4 shows a fabric for a use in the invention having all fluorocarbon fibers.

FIG. 5 shows a fabric for use in the invention having fluorocarbon fibers and fiberglass fibers.

FIG. 6 shows the dielectric material of the invention having a printed circuit bonded thereto.

FIG. 7 shows a stack of metal foils, dielectric sheets and a central printed circuit board just prior to lamination and bonding.

FIG. 8 is a diagram of the stack shown in FIG. 7 after being bonded by application of heat and pressure.

DETAILED DESCRIPTION OF THE INVENTION AND PREFERRED EMBODIMENTS WITH REFERENCE TO THE DRAWINGS

Dielectric materials having low dielectric constant are provided, the materials comprising fabrics impregnated with thermosetting resins, at least a portion of the fibers in the fabrics being fluorocarbon fibers. Also provided is a method of manufacture of these dielectric materials. The dielectric materials are useful in the fabrication of multilayer printed circuit boards.

An objective of this invention is to provide dielectric materials having a dielectric constant below 3.5 at 1 megahertz while exhibiting the desirable handling and fabricating characteristics of structures fabricated from thermosetting resins. A second objective is to provide a system of pre-preg sheets and innerlayer printed circuit laminates having a dielectric constant below 3.5 at 1 megahertz which can be fabricated into a homongeneous, void free, multilayer printed circuit. A further objective is to provide an economical process for fabricating these dielectric materials.

These objectives are accomplished by providing dielectric materials comprised of thermosetting resins reinforced with fluorocarbon fibers. More specifically, fluorocarbon fibers are treated under longitudinal tension, preferably with an alkali napthanate solution, to provide a wettable surface. The longitudinal tensioning of the fiber during treatment with an alkali napthanate is essential because, surprisingly, the fluorocarbon fiber shrinks up to approximately 20% during the treatment process if left unrestrained. The treated fiber is woven into a fabric using conventional weaving practices.

Untreated fluorocarbon fabric can not be impregnated with liquid thermosetting resins by known techniques. However, treated fluorocarbon fabric can be impregnated with a liquid thermosetting resin and partially cured to a dry, flexible sheet of B-stage pre-preg. One or more of the B-stage pre-preg sheets can be stacked together to a desired thickness and laminated under heat and pressure to form a laminated composite of thermosetting resin and fluorocarbon fabric. If epoxy is used as the thermosetting resin, then the fluorocarbon fabric laminated composite has a dielectric constant at 35 volume % epoxy of approximately 2.6 at 1 megahertz. The sheet of fluorocarbon fiber pre-preg can be bonded to one or two sheets of copper foil during the lamination process so that the laminated composite consists of dielectric material clad on one or both sides with copper foil. If epoxy is used as the thermosetting resin, then the resulting fluorocarbon fiber, copper clad laminate has a dielectric constant at 35 volume % of epoxy of 2.6 at 1 megahertz. The fluorocarbon fiber, copper clad laminate can be fabricated into a single-or-double-sided printed circuit board.

One or more innerlayers made from the fluorocarbon fiber, copper clad laminate can be interleaved with one or more fluorcarbon fiber pre-preg sheets and laminated together under heat and pressure to form a homogeneous, void free, multilayer structure. If epoxy is used as the thermosetting resin, then the multilayer structure has a nearly homogeneous resin composition when further processed into a multilayered printed circuit board.

This unique process of impregnating specially treated fluorocarbon fabrics with thermosetting resin has resulted in unique products which exhibit a dielectric constant below 3.5 and retain the processing and handling advantages of thermosetting resins. It is the only known method of fabricating homogeneous, void free, multilayer printed circuit boards having a uniform dielectric constant, being always below 3.5 at 1 megahertz.

Specific fluorocarbon fibers impart desirable physical properties to the laminated composite. Fluorocarbon fibers of drawn, sintered polytetrafluoroethylene (PTFE) made according to the teachings of U.S. Pat. No. 2,772,444 can be utilized in the present invention. However, the preferred fluorocarbon fiber for this invention is expanded, porous PTFE fiber made according to the teachings of U.S. Pat. Nos. 3,953,566 and 4,187,390. Laminated composites comprised of expanded PTFE fibers have higher flexural strength, higher tensile strength and a lower shrinkage after processing than laminates of drawn, sintered PTFE fiber.

It has also been found that very thin laminated composites can be prepared by calendering the fluorocarbon fabrics to a reduced thickness. Fabric woven from expanded PTFE fibers can be calendered to thicknesses of less than 0.0025 inches and two sheets of epoxy pre-preg from this fabric can yield a thin laminate with a dielectric core of 0.005 inch thickness. Dielectric cores of this thickness are very desirable for innerlayers and flexible circuits.

If it is desirable to increase the laminated composite's tensile strength, flexural strength, shrinkage after processing, or thermal coefficient of expansion, then other fibers than fluorocarbon fibers can be included in the composite structure. For example, fiberglass and treated fluorocarbon fibers can be woven into the same fabric and used as reinforcement for the thermosetting resins. Laminated composites composed of epoxy resin and expanded PTFE fabric containing less than 10 wt. % fiberglass have exhibited a dielectric constant of 2.8 at 1 megahertz while significantly improving the laminate's flexural strength, tensile strength, shrinkage after processing and thermal coefficient of expansion. A second method of including other fibers than fluorocarbon fibers into the fluorocarbon composite is to interleave sheets of fiberglass pre-preg with sheets of treated fluorocarbon fiber pre-preg. While this method can also yield a low dielectric constant laminated composite, it does not have the same desirable homogeneous structure.

An unexpected additional benefit of the fluorocarbon fiber laminated composites is their high flexibility. A laminated composite 0.008 inches thick, for example, of two sheets of expanded PTFE fabric impregnated with epoxy resin, can be bent around a 0.1 inch radius mandrel without breaking the PTFE fibers, while fiberglass fibers in an equivalent thickness FR-4 laminate will break when the laminate is bent over an equivalent diameter mandrel. The fluorocarbon fiber laminated composites can, therefore, be excellent dielectrics for flexible printed circuit boards.

When the fluorocarbon fibers are treated with an alkali napthanate, the surface of the fibers turns dark brown. In applications where this color is not desirable, the fibers can be bleached to a lighter color using heat or an oxidizing agent such as chlorine bleach. The lightening process must be controlled to insure that a wettable surface remains.

The detailed description of the invention is best provided by reference to the accompanying drawings and the examples below. FIG. 1A shows a conceptual process for making the pre-preg sheets according to this invention. Fabric 10 containing at least a portion of polytetrafluoroethylene fibers is fed from a feed roll over guide roll 12 into bath 14 containing the alkali napthanate treatment solution 16. Pinned guides 13 pierce the fabric and prevent its shrinkage in both the longitudinal and transverse directions during passage through the treatment solution 16. The treated fabric 10 emerges from the bath 16 and passes over guide roll 12 in the direction indicated by the arrow and enters water wash 18 wherein excess treatment solution is washed away. The fabric is then optionally bleached in chamber 19, using, for example, a chlorine bleach solution. The treated fabric then passes between optional compression rolls 20 wherein it may be reduced in thickness if desired. Liquid resin 22 is applied to the fabric from container 22 which wets the fabric and penetrates into its interstices. The coated fabric is heated in heater 26 to cure the resin to at least the B-stage cured or pre-preg sheet 29, and this wheet is cut into individual pre-preg sheets 30 by cutter 28.

FIG. 1B shows an alternate process for treating fibers for use in a fabric to make the pre-preg sheets of the invention. A PTFE fiber 40 is passed around first tension roll 42, over and around guide rolls 44 which guide the fiber through the treatment solution 48 in bath 46. The fiber emerges from the bath and passes around a second tension roll 50, rotating at substantially the same speed as the first tension roll 42, thereby preventing the fiber from shrinkage during treatment. The treated fiber is then formed into a fabric 52 as depicted in FIG. 1C, to be used in making the pre-preg sheets according to the invention.

FIG. 2 shows a stack of the pre-preg sheets 30 of the invention with a metal foil 32, preferably copper, placed above and below the sheets 30. On application of heat and pressure as depicted in FIG. 3, the resin in pre-preg sheets 30 is cured to a homogeneous, C-stage cured state to form the composite 34 and the metal foils 32 are firmly bonded to the composite 34.

FIG. 4 shows a portion of a woven fabric in which all fibers 40 are porous PTFE fibers, and FIG. 5 shows a portion of a fabric in which portion of the fibers 40 are porous PTFE and a portion are glass fibers 38.

FIG. 6 depicts a composite 34 from which a portion of the metal from metal foil 32 has been removed leaving electrical circuitry 60.

FIG. 7 shows the composite of FIG. 6 sandwiched between two pre-preg sheets 30 and having metal foils 32 above and below the pre-preg sheets 30. Wherever a layer of material in which the resin is in the C-stage state, i.e. layer 34, and wherever an electrically conductive foil or circuit, i.e. 32 or 60, contacts another layer, i.e. layers 30, the other layer is of material in the B-stage state.

FIG. 8 shows a composite of this invention 80 obtained by applying heat and pressure to the stack shown in FIG. 7. The resin in the center portion 36 has become homogeneous and fully cured to the C-stage state. The foils 32 are securely bonded to both sides of the composite 36.

The following examples are intended to be illustrative of the invention but will not limit the scope of the claims in any way.

EXAMPLE 1

A fabric was woven using conventional procedures form fibers of expanded polytetrafluoroethylene (PTFE) available commercially as GORE-TEX ® expanded PTFE weaving fibers from W. L. Gore & Associates, Inc., Elkton, MD. The fabric construction had 52 (400 denier) fibers per inch in the longitudinal direction and 52 (400 denier) fibers per inch in the transverse direction. The fabric was cut into six, 6 inch×6 inch sheets and immersed unrestrained for 30 seconds in an alkali napthanate solution, available commercially under the trademark TETRA-ETCH ®, also available from W. L. Gore & Associates, Inc., Elkton, MD. Following this treatment, the fabric was washed in warm tap water and rinsed in acetone. The treatment with the TETRA-ETCH ® solution caused the fibers to develop a dark brown color and resulted in the fabric shrinking approximately 20% in both the longitudinal and transverse directions. The fabric was stretched to nearly its original dimensions by grasping the fabric on its edges and manually stretching the fabric.

A liquid epoxy resin was prepared using the guidelines of Dow Chemical Company product brochure #296-396-783 for Dow epoxy resin 521-A80. When liquid epoxy resin was coated on untreated PTFE fabric, the resin beaded up and would not wet or penetrate the interstices between the fibers. Conversely, when the liquid epoxy resin was coated on the treated fabric, it wet the fabric and filled the interstices between the fibers to form a level, even coating over the fabric surface.

The six epoxy-coated treated fabric sheets were placed one at a time in a convection oven at 160° C., each for 4 minutes. When the sheets were removed from the oven and cooled, the epoxy resin was observed to have completely wetted the fabric and had been converted into a dry, flexible, semi-cured state known as B-stage pre-preg. The average resin pickup for each pre-preg sheet was 5 gms and the average thickness was approximately 0.14 inches.

The six pre-preg sheet were stacked one upon another and placed between FEP release sheets and stainless steel caul plates to form a lamination package. The package was placed in a Carver ® platen press which had been preheated to 175° C. and a pressure of 100 psi was applied. After three minutes the pressure was increased to 800 psi and the package was cured for 30 minutes at 175° C. The heaters were turned off and the package was allowed to cool to room temperature while still under the 800 psi pressure. The package was removed from the press and the laminated composite was separated from the FEP release sheets and caul plates.

The laminated composite was fully cured to the C-stage state, was approximately 0.45 inches thick and exhibited excellent resin wetting throughout the composite. There was no evidence of air entrapment, blistering, resin voids or delamination between the layers of fabric. Microscopic examination of cross sections of the laminated composite showed a uniform distribution of epoxy resin around the fibers, within the interstices of the fabric and between the layers of fabric.

EXAMPLE II

The same conditions and materials of Example I were used, except that the stack of pre-preg sheets was placed between sheets of 0.0014 inch thick copper foil instead of the FEP release sheets. After removing the cooled sample from the platen press, it was observed that the copper foil was intimately and securely bonded to the composite core of C-stage cured epoxy resin and GORE-TEX ® expanded PTFE fibers to form a structure known as a double-sided, copper clad laminate. The total laminate thickness was approximately 0.045 inches and the core thickness was approximately 0.042 inches. Using a capacitance bridge, the dielectric constant at 1 MHz of the laminate sample was determined to be approximately 2.8. The calculated weight percent fiber in the core was 63% and that of epoxy resin was 37%.

EXAMPLE III

A double-sided copper clad laminate was prepared as detailed in Example II and fabricated into a double-sided, plated-through-hole circuit board using standard techniques familiar to those skilled in the art. The circuit board was electrically conductive along circuit lines and across the plated-through hole connections.

EXAMPLE IV

Eight pre-preg sheets were prepared as described in Example I with the exception that the fabric construction had 64 fibers per inch of GORE-TEX ® expanded PTFE fiber in the longitudinal direction and 60 fibers per inch in the transverse direction. Three sheets of commercially available pre-preg FR-4 made from B-stage epoxy resin reinforced with a 7628 fiberglass fabric were placed in the stack of expanded PTFE pre-preg sheets and copper foil in the following order:

A = 0.0014 copper foil
B = epoxy/fiberglass pre-preg
C = epoxy/expanded PTFE fiber pre-preg

| Number of Sheets | Material |
| --- | --- |
| 1 | A |
| 1 | B |
| 4 | C |
| 1 | B |
| 4 | C |
| 1 | B |
| 1 | A |

This package was placed between stainless steel caul plates and processed into a double-sided copper clad laminate using the conditions described in Example II.

The C-stage cured laminate was void free and exhibited excellent adhesion between layers of fabric, copper foil and resin. The dielectric core was 0.092 inches thick and was composed of 15 wt. % fiberglass, 54 wt. % GORE-TEX ® expanded PTFE fibers and 31% C-stage epoxy resin. The dielectric constant of the composite was 2.9 at 1 MHZ.

The addition of 15 wt. % fiberglass significantly improved the mechanical properties of the composite as shown below:

Core Composition A = 55 wt. % Epoxy/45 wt. % GORE-TEX ® expanded PTFE fiber

Core Composition B = 15 wt. % Fiberglass/31 wt. % Epoxy/54 wt. % GORE-TEX ® expanded PTFE fiber

|                                           | A   | B   |
|-------------------------------------------|-----|-----|
| Flexural Strength × 10³ psi               | 12  | 20  |
| Flexural Modulus × 10³ psi                | 250 | 930 |
| Thermal Coefficient of Expansion ppm/° C. | 52  | 16  |

EXAMPLE V

A fabric was woven using conventional procedures from GORE-TEX ® expanded PTFE fibers and fiberglass fibers. The fabric construction had 64 expanded PTFE fibers per inch in the longitudinal direction and 60, 150 I/O, fiberglass fibers per inch in the transverse direction. Ten, 5 inch × 6 inch sheets of the fabric were treated with TETRA-ETCH ® and converted into an epoxy B-stage pre-preg using the procedure described in Example I.

A double-sided copper clad laminate was prepared from the pre-preg sheets using the procedure described in Example II, with the exception that the pre-preg sheets were alternately stacked at right angles to one another so that fiberglass fibers were running in both the x and y axes of the finished, cured laminate.

The laminate had a core thickness of 0.075 inches and was composed of 36 wt. % epoxy, 40 wt. % expanded PTFE fiber, and 24 wt. % fiberglass. The dielectric constant at 1 MHz was 3.4 and the mechanical properties also improved to the same degree as the fiberglass-containing sample of Example IV, as demonstrated by the samples thermal coefficient of expansion of 14 ppm/°C.

EXAMPLE VI

A fabric was woven using conventional procedures from 400 denier drawn, solid PTFE fiber, available commercially from E. I. DuPont under product designation Teflon ® TFE-Fluorocarbon Fiber. These fibers are multifilament fibers and are not expanded. The fabric construction had 60 fibers per inch in the longitudinal direction and 64 fibers per inch in the transverse direction.

Liquid epoxy resin would not wet the untreated PTFE fabric, but when the fabric was treated with TETRA-ETCH ®, it was albe to be processed by the methods described in Examples I and II. The DuPont PTFE fabric exhibited the fiber fabric, but same 20% shrinkage as the GORE-TEX ® expanded PTFE fiber fabric, but likewise could be stretched back to its near original size.

A double-sided copper clad laminate was fabricated using the methods described in Examples I and II. The laminate core was 0.088 inch thick, had a dielectric constant at 1 MHz of 2.6 and was composed of 32 wt. % epoxy resin and 68 wt. % DuPont fiber. The mechanical properties were slightly lower than laminate fabricated from the GORE-TEX ® expanded PTFE fiber.

Core Composition A = 32 wt. % Epoxy/68 wt. % DuPont PTFE fiber

Core Composition B = 55 wt. % Epoxy/45 wt. % GORE-TEX ® expanded PTFE fiber

|                                           | A   | B   |
|-------------------------------------------|-----|-----|
| Flexural Strength × 10³ psi               | 7   | 12  |
| Flexural Modulus × 10³ psi                | 250 | 250 |
| Thermal Coefficient of Expansion ppm/° C. | 58  | 52  |

EXAMPLE VII

Four hundred denier fibers of GORE-TEX ® expanded PTFE were treated with TETRA-ETCH ® napthanate solution before weaving into a fabric as opposed to treating the fabric after it was woven as described in Example I. The fiber was treated and washed in warm water while under longitudinal tension so as to prevent fiber shrinkage resulting in a more stable fabric construction. A fabric was woven from the fiber using a hand loom to minimize abrasion of the fibers. The fabric was then coated with liquid epoxy resin and converted into a pre-preg by the methods described in Example I. The pre-preg was well wetted by the epoxy resin and showed no evidence of voids or poor adhesion.

EXAMPLE VIII

A fabric was woven from 100 denier GORE-TEX ® expanded PTFE fibers using conventional procedures. The fabric had 80 fibers per inch in both the longitudinal and transverse directions. The fabric was treated with TETRA-ETCH ® alkali napthanate solution and stretched as described in Example I. The fabric at this point was approximately 0.005 inch thick. The fabric was passed between stainless steel calendering rolls set at approximately a 0.002 inch gap. After two passes through the calendering rolls, the fabric thickness was reduced to 0.0026 inches thick.

The fabric was converted into a pre-preg and double-sided copper clad laminate using the methods described in Examples I and II. The laminate containing the sheets of calendered fabric had a core thickness of 0.005 inch, which is a very desirable thickness for laminate used for mulitple layer printed circuit boards. The dielectric constant at 1 MHz was 2.8.

EXAMPLE IX

A fabric of 400 denier GORE-TEX ® expanded PTFE fiber was woven and treated with TETRA-ETCH ® alkali napthanate as described in Example I. The fabric was bleached to nearly its original white color by immersing the fabric for 5 minutes in Chlorox ® chlorine bleach at 175° F.–200° F. The bleached fabric was then converted into an epoxy pre-preg and unclad, cured laminate using the methods described in Example I.

The bleached fabric was wet by the liquid epoxy resin and the cured laminate was free of voids. Adhesion between the bleached fibers and cured epoxy resin was excellent.

EXAMPLE X

A double-sided copper clad laminate was made using the methods described in Examples I and II except that two sheets of fabric woven from 100 denier GORE-TEX ® expanded PTFE fibers were utilized. The core thickness was 0.008 inch and the dielectric constant at 1 MHz was 2.6.

The laminate was tested for flexibility by folding it back on itself with a 0.0 inch radius. While the copper foil cracked at the bend, the dielectric core maintained its integrity and did not crack or separate with up to 10 flexures. A double-sided copper clad commercial grade epoxy/fiberglass laminate, with a 0.006 inch thick core, was also bent with a 0.0 inch radius. The copper foil on the outside radius of the laminate cracked, but the epoxy/fiberglass core also cracked and after 2 flexures broke and separated into two parts.

EXAMPLE XI

Double-sided copper clad laminate and pre-preg were produced using the methods and conditions described in Example VIII. Three of the copper clad laminates were fabricated into double-sided innerlayer printed circuits using standard procedures. The three innerlayer printed circuits were interleaved with two sheets of pre-preg between each two innerlayer circuits for a total of four sheets of pre-preg in the stack. The stack was laminated under heat and pressure, imaged and plated using conventional procedures for fabricating multilayer printed circuit boards.

The completed multilayer printed circuit board was free of voids and exhibited good intralayer adhesion.

EXAMPLE XII

A fabric was woven using the materials and procedures described in Example I. The fabric was cut into 8 inch × 8 inch squares and placed over a 6 inch × 6 inch pin frame (tenter frame). The pin frame was a square, window frame type structure which had ⅛ inch long pins placed on 1 inch centers around the perimeter of the frame. The fabric was pressed onto the pins on one edge of the frame and stretched under moderate tension to the pins on the other side of the frame. The other two sides of the fabric square were likewise stretched and placed on the pins on the other remaining two sides of the pin frame. The fabric was thus restrained under moderate tension on all four sides.

The pin frame holding the fabric was immersed in an alkali napthanate solution for 30 seconds, washed in warm water and rinsed in acetone. The fabric developed the characteristically dark brown color, indicating effective treatment, but it did not shrink appreciably after being removed from the pin frame. The fabric was coated with epoxy resin and processed as described in Example I to a pre-preg and then into a laminated composite. The epoxy wetted the fabric acceptably and the fully cured laminated composite performed equivalently to the laminated composite of Example I.

While the invention has been disclosed herein in connection with certain embodiments and detailed descriptions, it will be clear to one skilled in the art that modifications or variations of such details can be made without deviating from the gist of this invention, and such modifications or variations are considered to be within the scope of the claims hereinbelow.

What is claimed is:

1. A dielectric material comprising a fabric having fibers and interstices between said fibers, in which at least a portion of the fibers in said fabric are treated fluorocarbon fibers, such treatment making the fluorocarbon fibers wettable by an uncured thermosetting resin, the fabric being impregnated within said interstices between said fibers with a themosetting resin cured to at least the semi-cured, B-stage state, the dielectric constant of said dielectric material being less than 3.5.

2. The dielectric material of claim 1 having a dielectric constant less than 3.0.

3. The dielectric material of claim 1 in which the thermosetting resin is cured to the fully-cured, C-stage state.

4. The dielectric material of claim 3 having an electrically conductive foil bonded to at least one surface thereof.

5. The dielectric material of claim 3 in sheet form having an electrically conductive foil bonded to at least one side thereof.

6. The dielectric material of claim 5 having an electrically conductive foil bonded to both sides thereof.

7. The dielectric material of claims 4, 5 or 6 wherein said foil is copper foil.

8. A laminated composite structure comprising one or more sheets of the dielectric material of claim 1 in which the thermosetting resin is cured to the fully-cured, C-stage state, and having an electrically conductive foil bonded to at least one side of at least one of said sheets.

9. A laminated composite structure comprising one or more sheets of the dielectric material of claim 1 in which the thermosetting resin is cured to the fully-cured, C-stage state, and one or more sheets of the dielectric material of claim 1 in which the thermosetting resin is cured to the semi-cured, B-stage state, wherein, wherever a layer of material in said C-stage state contacts another layer, said other layer is of material in said B-stage state.

10. A laminated composite structure comprising one or more sheets of the dielectric material of claim 1 in which the thermosetting resin is cured to the fully-cured, C-stage state, and having an electrically conductive foil bonded to at least one side of at least one of said sheets, and one or more sheets of the dielectric material of claim 1 in which the thermosetting resin is cured to the semi-cured, B-stage state, wherein, wherever a layer of material in said C-stage state, and wherein, wherever an electrically conductive foil contacts another layer, said other layer is of material in said B-stage state.

11. The composite of claim 9 or 10 wherein said thermosetting resin in the dielectric material is cured to the fully-cured, C-stage state, throughout said laminated composite.

12. The composite structure of claims 8, 9, 10 or 11, having at least one additional layer of a composite structure including material other than the dielectric material of claim 1.

13. The composite structure of claim 12 wherein said at least one additional layer is a layer selected from the group consisting of epoxy/fiberglass, fluorocarbon/fiberglass, polyimide/fiberglass, epoxy/polyaramide fiber, epoxy/quartz fiber and polyimide/quartz fiber composites.

14. The dielectric material of claim 1 wherein said thermosetting resin is selected from the group consisting of epoxy, polyimide, polyamide, polyester, phenolic and acrylic thermosetting resin.

15. The dielectric material of claim 1 wherein said thermosetting resin is an epoxy resin.

16. The dielectric material of claim 1 wherein all fibers in said fabric are fluorocarbon fibers.

17. The dielectric material of claim 1 wherein all fibers in said fabric other than fluorocarbon fibers are fiberglass fibers.

18. The dielectric material of claim 1 wherein all said fibers in said fabric other than fluorocarbon fibers are polyaramide fibers.

19. The dielectric material of claim 1 wherein all said fibers in said fabric other than fluorocarbon fibers are quartz fibers.

20. The dielectric material of claim 1 in which said fabric is a woven fabric.

21. The dielectric material of claim 1 in which said fabric is a non-woven felt or mat.

22. The dielectric material of claim 1 wherein said fluorocarbon fibers are PTFE fibers.

23. The dielectric material of claim 1 wherein said fluorocarbon fibers are drawn, nonporous, sintered PTFE fibers.

24. The dielectric material of claim 1 wherein said fluorocarbon fibers are expanded, porous PTFE fibers.

25. The dielectric material of claim 1 wherein said fluorocarbon fibers contain a filler.

26. The dielectric material of claim 25 wherein said filler is a dielectric insulator material.

27. The dielectric material of claim 26 wherein said filler is selected from the class consisting of ceramic and glass.

28. The dielectric material of claim 25 wherein said filler is electrically conductive or semi-conductive.

29. The dielectric material of claim 28 wherein said filler is selected from the class consisting of electrically conductive or semi-conductive metals, metal oxides or carbon.

30. The dielectric material of claim 3 used in a printed circuit laminated composite.

31. The dielectric material of claim 3 used in a dielectric insulator.

32. The dielectric material of claim 3 used in a submicrowave dielectric insulator.

33. The dielectric material of claim 3 used in a microwave dielectric insulator.

34. The dielectric material of claim 3 used in a microwave printed circuit board.

35. The dielectric material of claim 3 used in a microwave radome.

* * * * *

UNITED STATES PATENT AND TRADEMARK OFFICE
CERTIFICATE OF CORRECTION

PATENT NO. : 4,680,220

DATED : July 14, 1987

INVENTOR(S) : Daniel D. Johnson

It is certified that error appears in the above-identified patent and that said Letters Patent is hereby corrected as shown below:

In column 1, line 68, "6.II" should read —6.11—

In column 3, line 11, after ceramic, "Wc" should be deleted.

In column 3, line 21, "tensin" should read —tension—

In column 9, line 45, "albe" should read —able—

Signed and Sealed this

Fourteenth Day of June, 1988

Attest:

DONALD J. QUIGG

*Attesting Officer*  *Commissioner of Patents and Trademarks*